(12) United States Patent
Gander et al.

(10) Patent No.: US 8,312,355 B2
(45) Date of Patent: Nov. 13, 2012

(54) INTEGRATED CIRCUIT TO ENCODE DATA

(75) Inventors: Martial Gander, Sophia-antipolis (FR); Emmanuel Ardichvili, Sophia-antipolis (FR)

(73) Assignee: ST-Ericsson SA, Geneva (CH)

( * ) Notice: Subject to any disclaimer, the term of this patent is extended or adjusted under 35 U.S.C. 154(b) by 578 days.

(21) Appl. No.: 12/514,424

(22) PCT Filed: Nov. 12, 2007

(86) PCT No.: PCT/IB2007/054588
§ 371 (c)(1),
(2), (4) Date: Jan. 14, 2010

(87) PCT Pub. No.: WO2008/059431
PCT Pub. Date: May 22, 2008

(65) Prior Publication Data
US 2010/0115378 A1    May 6, 2010

(30) Foreign Application Priority Data

Nov. 14, 2006 (EP) ................................ 06291775

(51) Int. Cl.
*H03M 13/00* (2006.01)
(52) U.S. Cl. ...................... 714/781; 326/39; 370/252
(58) Field of Classification Search ............... 714/781; 326/39; 370/252
See application file for complete search history.

(56) References Cited

U.S. PATENT DOCUMENTS

| 5,703,882 | A | 12/1997 | Jung et al. |
| 6,130,553 | A * | 10/2000 | Nakaya ........................... 326/39 |
| 6,751,772 | B1 | 6/2004 | Kim et al. |
| 6,807,155 | B1 * | 10/2004 | Subramanian ................ 370/252 |
| 2001/0025358 | A1 | 9/2001 | Eidson |
| 2004/0008768 | A1 | 1/2004 | Banba |

OTHER PUBLICATIONS

PCT International Search Report and Written Opinion, PCT/IB2007/054588, mailing date May 16, 2008.

\* cited by examiner

*Primary Examiner* — Sam Rizk
(74) *Attorney, Agent, or Firm* — William J. Kubida; Peter J. Meza; Hogan Lovells US LLP

(57) ABSTRACT

An integrated circuit configurable to encode data according to a number of coding schemes and to generate cyclic redundancy codes, includes a number of identical specific hardware cells, and each cell includes four outputs for binary signals, four inputs for binary signals, a buffer to delay by one clock period a binary value received on an input and to output a one-clock period delayed binary value, binary adders to perform XOR operations, configurable multiplexers connecting the outputs, the inputs, the buffer and the adders to each other according to several configurable paths, and controllable switch matrices external to each cell and able to electrically connect and disconnect inputs to or from outputs of another cell.

15 Claims, 11 Drawing Sheets

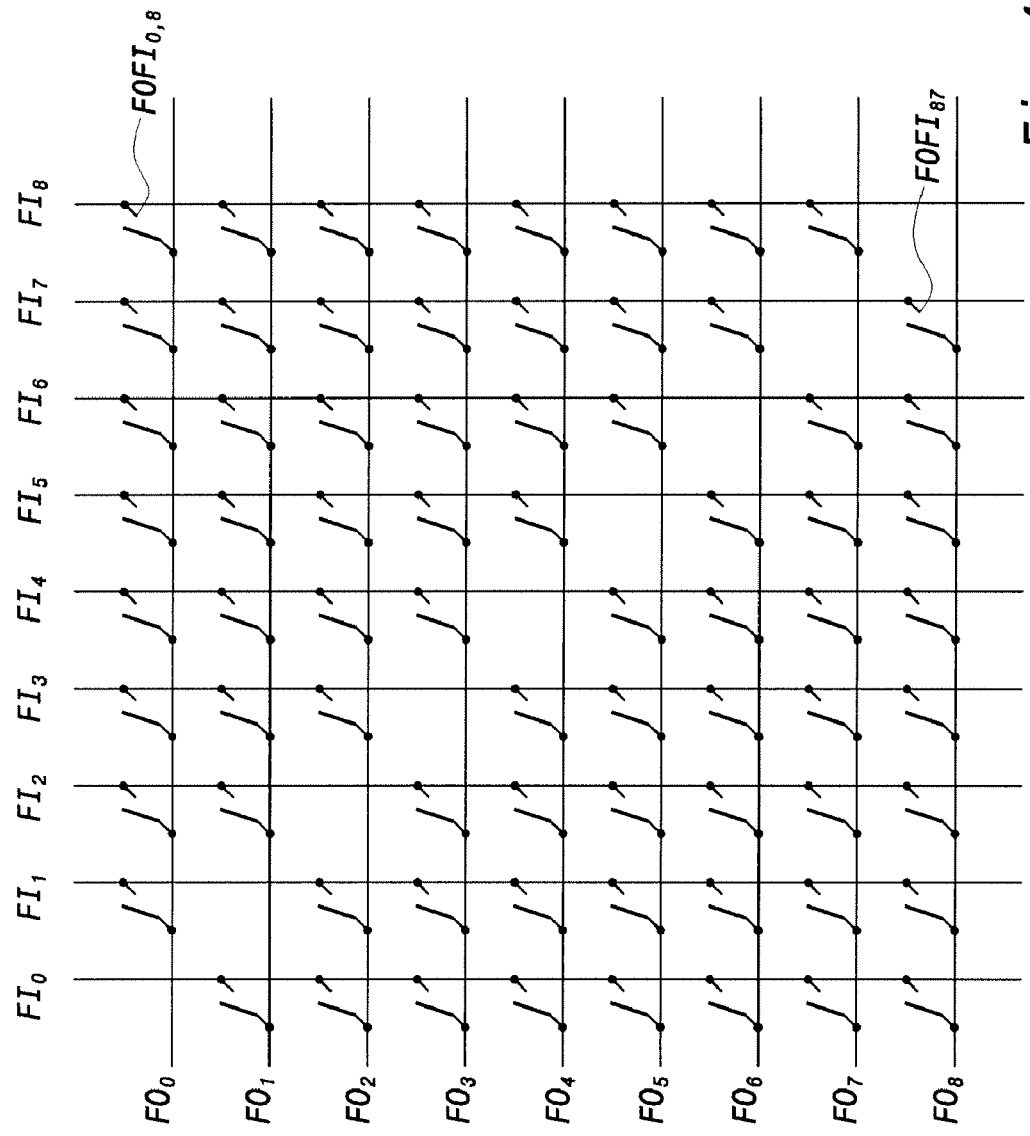

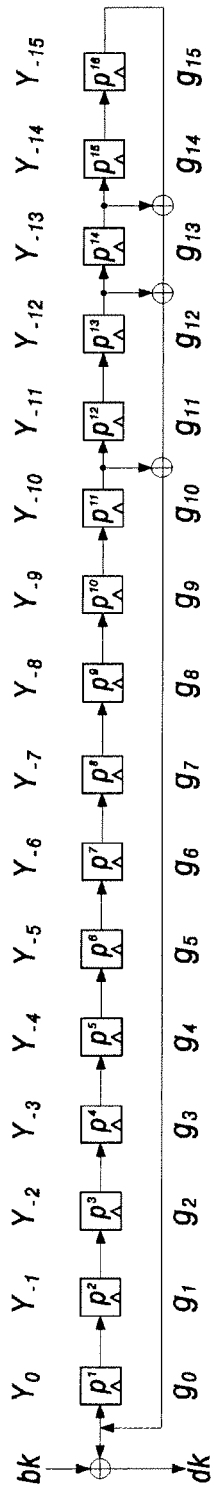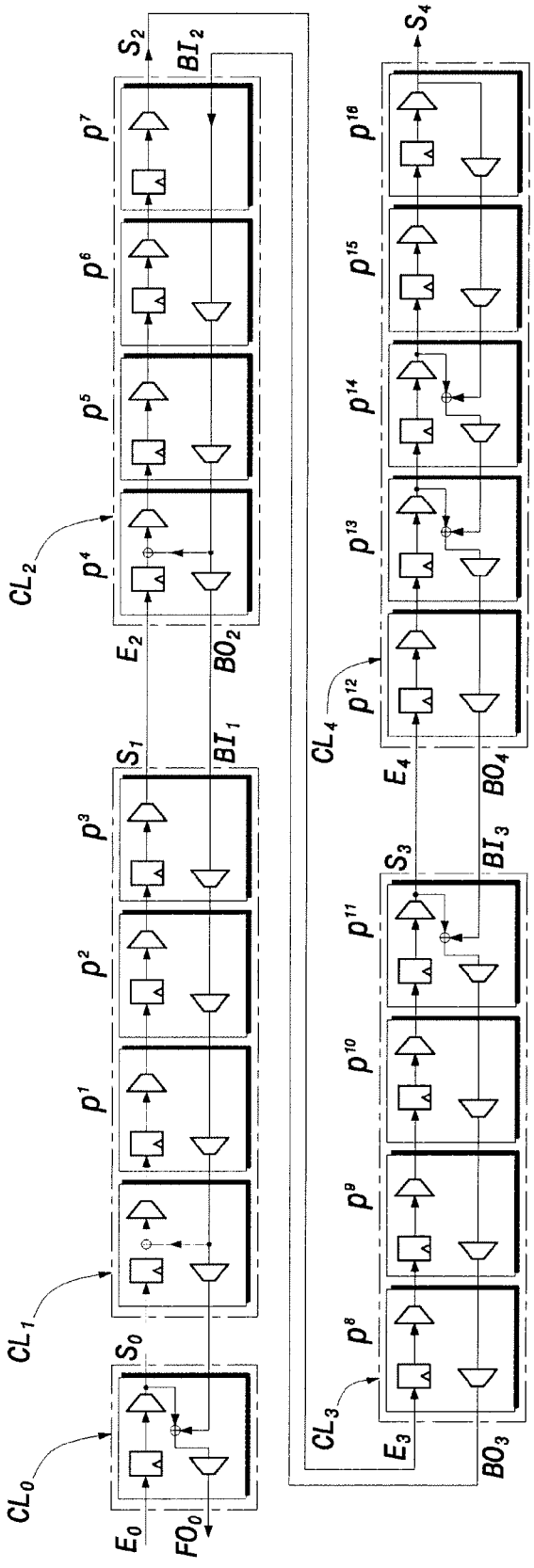
Fig. 13A
Fig. 13B

INTEGRATED CIRCUIT TO ENCODE DATA

CROSS-REFERENCE TO RELATED APPLICATIONS

The present application is a national filing in the U.S. Patent & Trademark Office of PCT/IB2007/054588 filed Nov. 12, 2007, and claims priority of European Patent Application No. 06291775.2 filed Nov. 14, 2006, both of which applications are incorporated herein in their entireties by this reference.

Integrated configurable circuits exist to encode data according to any one of a plurality of coding schemes and/or to generate cycle redundancy codes. Typically, the code scheme comprises block, convolutional and turbo codes.

FIELD OF THE INVENTION

The present invention relates to integrated circuit to encode data.

BACKGROUND OF THE INVENTION

There exist integrated configurable circuits to encode data according to any one of a plurality of coding schemes and/or to generate cycle redundancy codes. Typically, the code scheme comprises block, convolutional and turbo codes.

Ideally such a circuit should be very flexible, that is, able to be configured to execute many different coding schemes and/or to generate many different cyclic redundancy codes. This circuit should also excel in the efficient execution (power, chip area, flexibility) of these schemes. However, flexibility and execution efficiency are inversely related. For example, a more flexible circuit results in slower execution speed. In contrast, a faster circuit is less flexible. Attempts to build circuits which are pretty flexible while remaining fast have been disclosed. For example, U.S. Pat. No. 6,807,155 to Subramanian discloses ranking functions which are common to different telecommunication processing standards according to their computational intensity. The design of the telecommunication processing is based on the function ranking to speed up the execution while remaining flexible.

SUMMARY OF THE INVENTION

Accordingly, it is an object of the invention to provide an integrated circuit which is more flexible than dedicated hardware integrated processors while being faster than non-dedicated hardware processors and less power-hungry.

The invention provides an integrated circuit configurable to encode data according to any one of the coding schemes chosen in a predetermined plurality of coding schemes and to generate cyclic redundancy codes, said predetermined plurality of coding schemes comprising block, convolutional and turbo codes, wherein the integrated circuit comprises:

a) a plurality of specific hardware cells, each cell comprising:
  outputs $S_{ij}$, $FO_{ij}$, $BO_{ij}$ and $TO_{ij}$ for binary signals,
  inputs $E_{ij}$, $BI_{ij}$, $FI_{ij}$ and $TI_{ij}$ for binary signals,
  a buffer to delay by one clock period a binary value received on input $E_{ij}$ and to output a one-clock period delayed binary value $E^*$,
  binary adders to perform XOR operations,
  configurable multiplexers BM, FM, MM and TM connecting the outputs, the inputs, the buffer and the adders to each other according to several configurable paths, the characteristic equations of the cell being:

$$S_{ij} = \text{Output}Mux4$$

$$\text{Output}Mux4 = Cmm0 \cdot Cmm1 \cdot E^* + !Cmm0 \cdot Cmm1 \cdot (E^*XOR+BI_{ij}) + Cmm0 \cdot !Cmm1 \cdot E + !Cmm0 \cdot !Cmm1 \cdot (E_{ij}XORFI_{ij})$$

$$BO_{ij} = Cbm \cdot (S_{ij}XORBI_{ij}) + !Cbm \cdot BI_{ij}$$

or $$TO_{ij} = S_{ij} = Ctm \cdot TI_{ij} + !Ctm \cdot \text{Output}Mux4$$

$$\text{Output}Mux4 = Cmm0 \cdot Cmm1 \cdot E^* + !Cmm0 \cdot Cmm1 \cdot (E^*XORBI_{ij}) + Cmm0 \cdot !Cmm1 \cdot E + !Cmm0 \cdot !Cmm1 \cdot (E_{ij}XORFI_{ij})$$

$$BO_{ij} = Cbm \cdot (S_{ij}XORBI_{ij}) + !Cbm \cdot BI_{ij}$$

or $$BO_{ij} = Cbm0 \cdot Cbm1 \cdot (S_{ij}XORBI_{ij}) + !Cbm0 \cdot Cbm1 \cdot BI_{ij} + !Cbm0 \cdot Cbm1 \cdot S_{ij}$$

$$FO_{ij} = Cfm \cdot (S_{ij}XORFI_{ij}) + !Cfm \cdot FI_{ij}$$

where:
  $S_{ij}$, $FO_{ij}$, $BO_{ij}$ and $TO_{ij}$ are the binary signals output on outputs $S_{ij}$, $FO_{ij}$, $BO_{ij}$ and $TO_{ij}$, respectively,
  $E_{ij}$, $BI_{ij}$, $FI_{ij}$ and $TI_{ij}$ are the binary signals received on inputs $E_{ij}$, $BI_{ij}$, $FI_{ij}$ and $TI_{ij}$, respectively,
  "!" is the NOT operation,
  "*" is the output of the buffer,
  "XOR" is the XOR operation,
  "+" is the OR operation,
  "·" is the AND operation,
  Cbm, Cbm0, Cbm1, Cfm, Cmm0, Cmm1 and Ctm are respective binary values that represent the configuration of each multiplexer, b) controllable switch matrices external to each cell and able:
  to electrically connect and, alternatively, to electrically disconnect input $E_{ij}$ to/from at least the output $S_{ij}$ of another cell and to electrically connect and, alternately, to electrically disconnect input $E_{ij}$ to/from an external binary data source,
  to electrically connect and, alternately, to electrically disconnect at least input $FI_{ij}$ to/from at least the output $FO_{ij}$ of another cell,
  to connect and, alternately, to disconnect input $BI_{ij}$ to/from at least the output $BO_{ij}$ of another cell.

The invention also provides an integrated circuit configurable to encode data according to any one of the coding schemes chosen in a predetermined plurality of coding schemes and to generate cyclic redundancy codes, said predetermined plurality of coding schemes comprising block and convolutional codes, wherein the integrated circuit comprises:

a) a plurality of specific hardware cells, each cell comprising:
  outputs $S_{ij}$, $FO_{ij}$, and $BO_{ij}$ for binary signals,
  inputs $E_{ij}$, $BI_{ij}$, and $FI_{ij}$ for binary signals,
  a buffer to delay by one clock period a binary value received on input $E_{ij}$ and to output a one-clock period delayed binary value $E^*$,
  binary adders to perform XOR operations,
  configurable multiplexers connecting the outputs, the inputs, the buffer and the adders to each other according to several configurable paths, the characteristic equations of the cell being:

$$S_{ij} = \text{Output}Mux4$$

$$\text{Output}Mux4 = Cmm0 \cdot Cmm1 \cdot E^* + !Cmm0 \cdot Cmm1 \cdot (E^*XOR+BI_{ij}) + Cmm0 \cdot !Cmm1 \cdot E + !Cmm0 \cdot !Cmm1 \cdot (E_{ij}XORFI_{ij})$$

$$BO_{ij} = Cbm \cdot (S_{ij}XORBI_{ij}) + !Cbm \cdot BI_{ij}$$

or $$BO_{ij}=Cbm0 \cdot Cbm1 \cdot (S_{ij} XORBI_{ij})+!Cbm0 \cdot Cbm1 \cdot BI_{ij}+ !Cbm0 \cdot Cbm1 \cdot S_{ij}$$

$$FO_{ij}=Cfm \cdot (S_{ij} XORFI_{ij})+!Cfm \cdot FI_{ij}$$

where:
- $S_{ij}$, $FO_{ij}$ and $BO_{ij}$ are the binary signals output on outputs $S_{ij}$, $FO_{ij}$ and $BO_{ij}$, respectively,
- $E_{ij}$, $BI_{ij}$ and $FI_{ij}$ are the binary signals received on inputs $E_{ij}$, $BI_{ij}$ and $FI_{ij}$, respectively,
- "!" is the NOT operation,
- "*" is the output of the buffer,
- "XOR" is the XOR operation,
- "+" is the OR operation,
- "·" is the AND operation,
- Cbm, Cbm0, Cbm1, Cfm, Cmm0, and Cmm1 are respective binary values that represent the configuration of each multiplexer, b) controllable switch matrices external to each cell and able:
- to electrically connect and, alternatively, to electrically disconnect input $E_{ij}$ to/from at least the output $S_{ij}$ of another cell and to electrically connect and, alternately, to electrically disconnect input $E_{ij}$ to/from an external binary data source,
- to electrically connect and, alternately, to electrically disconnect at least input $FI_{ij}$ to/from at least the output $FO_{ij}$ of another cell,
- to connect and, alternately, to disconnect input $BI_{ij}$ to/from at least the output $BO_{ij}$ of another cell.

The above integrated circuits are more flexible than any dedicated hardware processor because cells and connections between cells can be configured to implement a great number of coding schemes and CRC (Cyclic Redundancy Code) scheme. The above integrated circuit is also faster than any general purpose hardware processor like DSP (Digital Signal Processor), because it comprises specific hardware cells able to execute operations as fast as dedicated hardware processors.

Finally, because specific cells are identical to each other, the implementation on the die of a chip of such an integrated circuit can be done with a great efficiency. Furthermore, the configuration of these cells as well as the configuration of the connections between cells is also made easier.

The embodiments of the above integrated circuits may comprise one or several of the following features:
- the integrated circuit comprises a plurality of clusters $CL_j$, each cluster $CL_j$ comprising:
  - inputs $E_j$, $FI_j$ and $BI_j$,
  - outputs $S_j$, $BO_j$ and $FO_j$,
  - a succession of at least two cells $C_{ij}$ successively electrically connected to each other, the first cell of the succession having its inputs $E_{ij}$ and $F_{ij}$ and its output $BO_{ij}$ directly connected to inputs $E_j$, $FI_j$ and $BO_j$, respectively,
  - the last cell of the succession having its input $BI_{ij}$ and its outputs $S_{ij}$ and $FO_{ij}$ directly connected to input $BI_j$, output $S_j$ and output $FO_j$, respectively of another cell outside this cluster, and
  - any cell other than the last cell having its input $BI_{ij}$ and its outputs $S_{ij}$ and $FO_{ij}$ connected, without any configuration possibility, to output $BO_{ij}$ and inputs $E_{ij}$ and $FI_{ij}$ of the following cell of the succession, respectively, and
- the switch matrix is only able to configure the electrical connections between cluster inputs and outputs without being able to configure the electrical connections between cells within a cluster,
- the outputs $S_j$, $FO_j$ and the input $BI_j$ of at least one cluster are connected to inputs $E_j$, $FI_j$ and output $BO_j$ of another cluster without configuration possibility, respectively,
- the integrated circuit comprises between five to ten clusters and each cluster is composed of five cells,
- each cluster has at least one cell having the following characteristic equation:

$$BO_{ij}=Cbm0 \cdot Cbm1 \cdot (S_{ij} XORBI_{ij})+!Cbm0 \cdot Cbm1 \cdot BI_{ij}+ !Cbm0 \cdot Cbm1 \cdot S_{ij}$$

- the inputs $TI_{ij}$ of the succession of cells of a cluster, are directly connected to respective outputs $TO_{ij}$ of the succession of cells of another cluster without any configuration possibility.

The above embodiments of the integrated circuit present the following advantages:
- using clusters cluster reduces the size of the switch matrices,
- connecting a cluster to another cluster without configuration possibility also reduces the size of the switch matrices,
- using between five to ten clusters of five cells constitutes an optimum implementation of the integrated circuit to achieve the greatest possible flexibility while still maintaining the number of cells as small as possible,
- having only one cell in each cluster that corresponds to the characteristic equation $$BO_{ij}=Cbm0 \cdot Cbm1 \cdot (S_{ij} XORBI_{ij})+!Cbm0 \cdot Cbm1 \cdot BI_{ij}+ !Cbm0 \cdot Cbm1 \cdot S_{ij}$$

is enough to configure the integrated circuit to generate CRC codes,
- connecting outputs $TO_{ij}$ to inputs $TI_{ij+2}$ without any configuration possibility simplifies the connections between adjacent clusters while still maintaining a high degree of flexibility.

These and other aspects of the invention will be apparent from the following description, drawings and claims.

BRIEF DESCRIPTION OF THE DRAWINGS

FIG. 4A is a schematic illustration of a switch matrix implemented within the circuit of FIG. 4, FIG. 13A is a schematic diagram of a randomization or scrambling circuit, and FIG. 13B is a schematic diagram of the integrated circuit of FIG. 4 configured to implement the randomization or scrambling circuit of FIG. 13A.

DETAILED DESCRIPTION

Figure 1:
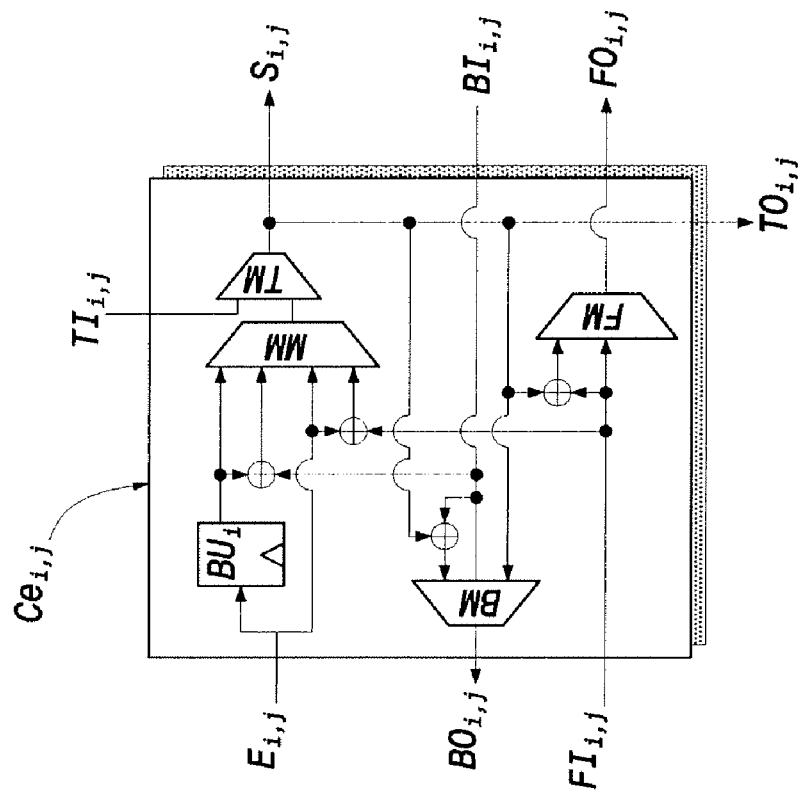
FIGS. 1 and 2 are schematic diagram of a first cell and a second cell used in the implementation of an integrated circuit.

FIG. 1 shows a hardware specific cell $C_{ij}$ that can be used to realize an integrated circuit which can be configured to perform the following operations:
- CRC generation that complies with anyone of the following standards: GSM (Global System for Mobile Communication), UMTS (Universal Mobile Telecommunication System), DMB (Digital Multimedia Broadcasting), DAB (Digital Audio Broadcasting), CDMA 2000 (Code Division Multiple Access 2000), WPAN (Wireless Personal Area Network), WLAN (Wireless Local Area Network), WMAN (Wireless Metropolitan Area Network),
- Convolutional encoding operations that comply with any one of the following standards: GSM, UMTS, DMB, CDMA 2000, iDEN (Integrated Digital Enhanced Network), PHS (Personal Handy-phone System), PDC (Personal Digital Cellular), WPAN, WLAN, WMAN, DVB (Digital Video Broadcasting), and
- Turbo encoding operations that comply with any one of the following standards: UMTS, SDMB (Satellite Digital Multimedia Broadcasting), CDMA 2000, WMAN, and
- Randomization and scrambling operations that comply with any one of the following standards: UMTS, CDMA 2000, WMAN, WLAN, DMB, DAB, DVB.

The integrated circuit can also run chips spreading process. Cell $C_{ij}$ includes:
- four binary inputs $E_{ij}$, $BI_{ij}$ and $TI_{ij}$,
- four binary outputs $S_{ij}$, $FO_{ij}$, $BO_{ij}$, $TO_{ij}$,
- one buffer $BU_i$ directly connected to input $E_{ij}$ and that outputs a value $E^*$,
- four adders $A_{1i}$, $A_{2i}$, $A_{3i}$ and $A_{4i}$, and
- four multiplexers MM, TM, BM and FM.

Buffer $BU_i$ is able to delay the binary value received on input $E_{ij}$ by one clock period to output a binary value $E^*$. The output of buffer $BU_i$ is directly connected to a first input of multiplexer MM and to a first input of adder $A_{1i}$. A second input of adder $A_{1i}$ is directly connected to input $BI_{ij}$. The output of adder $A_{1i}$ is directly connected to a second input of multiplexer MM. Adder $A_{1i}$ provides on its output the result of an XOR operation between its inputs.

Input $E_{ij}$ is directly connected to a third input of multiplexer MM and to a first input of adder $A_{3i}$. A second input of adder $A_{3i}$ is directly connected to input $FI_{ij}$. The output of adder $A_{3i}$ is directly connected to a fourth input of multiplexer MM.

Multiplexer MM has an output connected to a first input of multiplexer TM. Multiplexer MM is able to directly connect any one of its inputs to the output depending on a configuration bit value stored in a cell configuration bit register. Thus, once a selected input is connected to the output, the multiplexer behave like if the selected input was directly wired to the output. This is also true for any of the multiplexers used in cell $E_{ij}$.

A second input of multiplexer TM is directly connected to input $T_{ij}$. The output of multiplexer TM is directly connected to output $S_{ij}$.

The output of multiplexer BM is directly connected to output $BO_{ij}$. A first and a second input of multiplexer BM are directly connected to input $BI_{ij}$ and an output of adder $A_{2i}$, respectively.

Adder $A_{2i}$ has a first and a second input directly connected to the output of multiplexer TM and to input $BI_{ij}$, respectively.

An output of multiplexer FM is directly connected to output $FO_{ij}$. Multiplexer FM has a first and a second input directly connected to input $FI_{ij}$ and to an output of adder $A_{4i}$ respectively.

Adder $A_{4i}$ has a first and second input directly connected to the output of multiplexer TM and to input $FI_{ij}$, respectively.

Output $TO_{ij}$ is directly connected at the output of multiplexer TM.

Accordingly, cell $C_{ij}$ has the following characteristic equations:

$$TO_{ij} = S_{ij} = Ctm \cdot TI_{ij} + !Ctm \cdot \text{Output}Mux4 \quad (1)$$

$$\begin{aligned}\text{Output}Mux4 = &Cmm0 \cdot Cmm1 \cdot E^* + !Cmm0 \cdot Cmm1 \cdot \\ &(E^* \cdot XORBI_{ij}) + Cmm0 \cdot !Cmm1 \cdot E_{ij} + \\ &!Cmm0 \cdot !Cmm1 \cdot (E_{ij} XORFI_{ij})\end{aligned} \quad (2)$$

$$BO_{ij} = Cbm \cdot (S_{ij} XORBI_{ij}) + !Cbm \cdot BI_{ij} \quad (3)$$

$$FO_{ij} = Cfm \cdot (S_{ij} XORFI_{ij}) + !Cfm \cdot FI_{ij} \quad (4)$$

where:
- symbol "!" corresponds to the NOT operation
- symbol "*" refers to the output of buffer $BU_i$,
- symbol "XOR" corresponds to the XOR operation,
- symbol "+" corresponds to the OR operation,
- symbol "·" corresponds to the AND operation,
- Cmm0 and Cmm1 are binary values that depend on the configuration of multiplexer MM,
- Ctm, Cbm and Cfm are binary values that depend on the configuration of multiplexer TM, BM and FM, respectively.

More precisely, the value of binary values Cmm0 and Cmm1 are defined by the following table where the first column recites which input is directly connected to the output of multiplexer MM and the second and third columns recite the values of Cmm0 and Cmm1, respectively.

TABLE 1

| Input | Cmm0 | Cmm1 |
|---|---|---|
| E* | 1 | 1 |
| $2^{nd}$ Input | 1 | 0 |
| $3^{rd}$ Input | 0 | 1 |
| $4^{th}$ Input | 0 | 0 |

Ctm is equal to "1" when multiplexer TM is configured to directly connect input $TI_{ij}$ to output $S_{ij}$ and equal to "0" when multiplexer TM is configured to directly connect the output of multiplexer MM to output $S_{ij}$.

Cbm is equal to "1" when multiplexer BM is configured to directly connect the output of adder $A_{2i}$ to output $BO_{ij}$. Otherwise, Cbm is equal to "0" when multiplexer BM is configured to directly connect input $BI_{ij}$ to output $BO_{ij}$.

Cfm is equal to "1" when multiplexer FM is configured to directly connect the output of adder $A_{4i}$ to output $FO_{ij}$. Otherwise, Cfm is equal to "0" when multiplexer FM is configured to directly connect input to output $FO_{ij}$.

Figure 2:
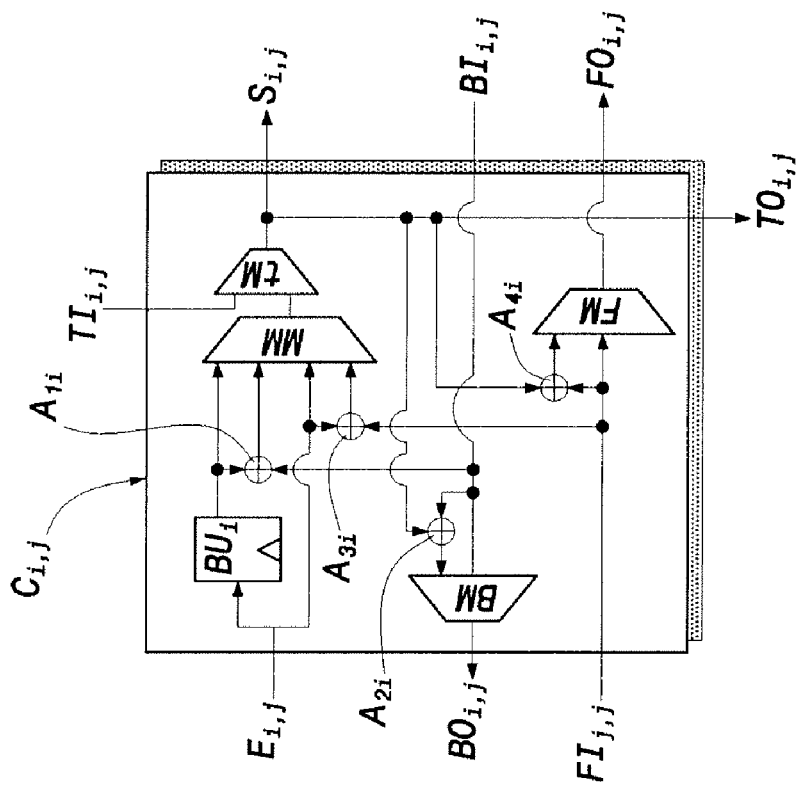

FIG. 2 shows a specific hardware cell $Ce_{i,j}$ which is identical to cell $C_{i,j}$ except that multiplexer BM has a third input directly connected to output $TO_{ij}$ and $S_{ij}$. Accordingly, the characteristic equations of cell $Ce_{ij}$ are identical to equations (1) to (4) except that equation (3) is replaced by the following characteristic equation:

$$BO_{ij} = Cbm0 \cdot Cbm1 \cdot (S_{ij} XORBI_{ij}) + !Cbm0 \cdot Cbm1 \cdot BI_{ij} + !Cbm0 \cdot Cbm1 \cdot S_{ij} \quad (5)$$

where Cbm0 and Cbm1 are binary values which depend on the configuration of multiplexer BM.

More precisely, the values of Cbm0 and Cbm1 are defined according to the following table where the first column recites which input of multiplexer BM is directly connected to output $BO_{ij}$, and the second and third columns recite the corresponding value of Cbm0 and Cbm1.

TABLE 2

|  | Cbm0 | Cbm1 |
|---|---|---|
| 1$^{st}$ input | 1 | 1 |
| $BI_{ij}$ | 1 | 0 |
| $S_{ij}$ | 0 | 1 |

Figure 3:
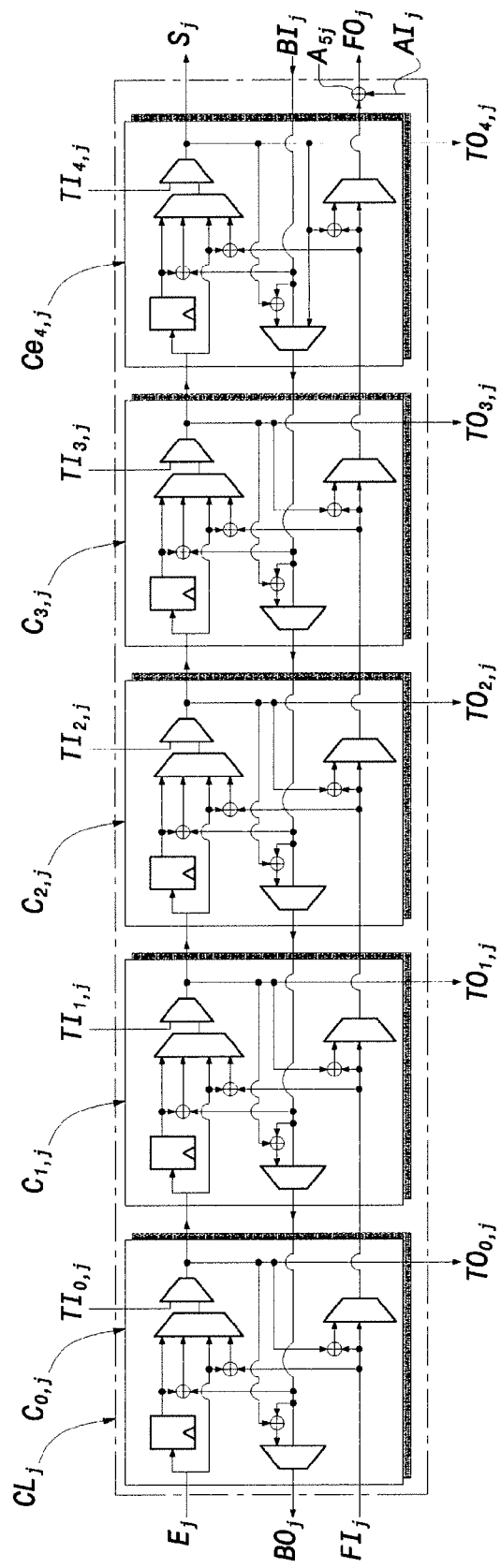
FIG. 3 is a schematic diagram of a cluster built from cells of FIGS. 1 and 2.

FIG. 3 shows a cluster $CL_j$ which is formed by the connection in series of five cells $C_{0,j}$, $C_{1,j}$, $C_{2,j}$, $C_{3,j}$ and $Ce_{4,j}$. In the following specification, the first index "i" of the cell name $C_{i,j}$ indicates the position of the cell within a cluster and index "j" indicates the cluster in which is situated the cell $C_{ij}$ or $Ce_{ij}$.

Cluster $CL_j$ has four inputs $E_j$, $FI_j$, $BI_j$ and $AI_j$ as well as three outputs $S_j$, $FO_j$, and $BO_j$.

Inputs $E_j$ and $FI_j$ and output $BO_j$ are directly connected to input $E_{0,j}$, $FI_{0,j}$ and output $BO_{0,j}$ of cell $C_{0,j}$, respectively. Outputs $S_j$, and input $BI_j$ are directly connected to outputs $S_{4,j}$, and input $BI_{4,j}$ of cell $Ce_{4,j}$, respectively.

Each cluster $CL_j$ includes an additional adder $A_{5,j}$ which has a first and a second inputs directly connected to output $FO_{4,j}$ and input $AI_j$, respectively. The output of adder $A_{5,j}$ is directly connected to output $FO_j$ of cluster $CL_j$.

Within a cluster, except for the last cell $Ce_{4,j}$, each cell $CI_{ij}$ is directly connected to the following cell in the following way:
  outputs $S_{ij}$ and $FO_{ij}$ are directly connected to inputs $E_{i+1,j}$ and $FI_{i+1,j}$ of the following cell $C_{i+1,j}$, and
  input $BI_{ij}$ is directly connected to output $BO_{i+1,j}$ of the following cell $C_{i+1,j}$.

The above connections between cells within a cluster are etched within the die of the integrated circuit. Thus, they cannot be modified or configured latter on.

Cluster $CL_j$ has also five inputs $TI_{i,j}$ which are directly connected to the respective corresponding input $TI_{i,j}$ of the corresponding cells. Cluster $CL_j$ has also five outputs $TO_{i,j}$ which are directly connected to the respective corresponding output $TO_{i,j}$ of the corresponding cell.

Figure 4:
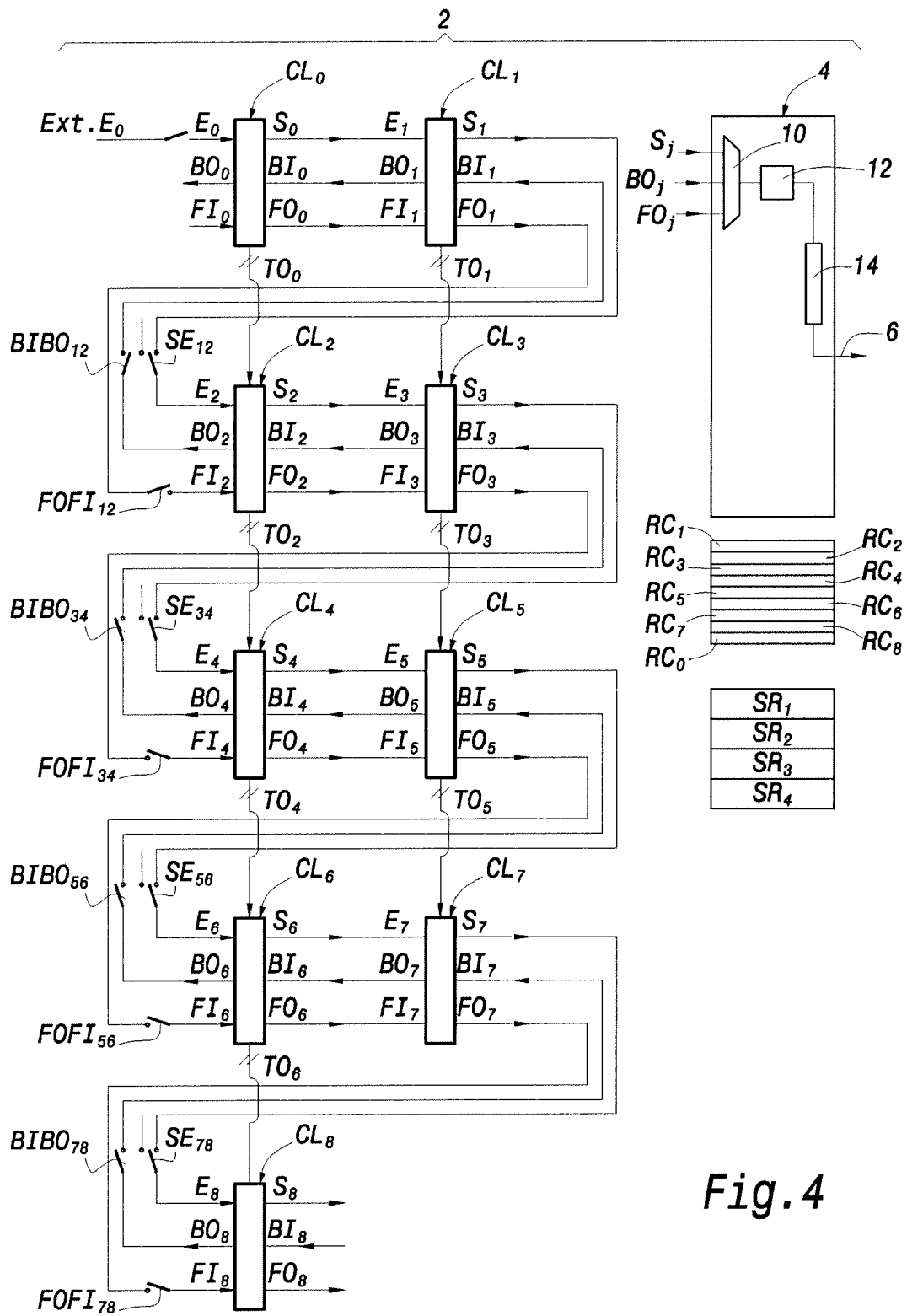
FIG. 4 is an example schematic diagram of an integrated circuit built from the cluster of FIG. 3.

FIG. 4 shows some parts of an integrated circuit 2 which is etched on the die of a chip.

Circuit 2 includes nine clusters $CL_0$ to $CL_8$ which are arranged on the surface of the die to form two columns and five rows. More precisely, clusters $CL_0$, $CL_2$, $CL_4$, $CL_6$ and $CL_8$ form the first column whereas clusters $CL_1$, $CL_3$, $CL_5$ and $CL_7$ form the second column.

The inputs and outputs of each cluster are connected to each other through configurable connections. The connections between clusters can be configured through the use of switch matrices. For example, circuit 2 includes five switch matrices.

A first switch matrix SE can electrically connect and, alternately, disconnect input $E_j$ to/from any output $S_k$ where "k" is different from "j" or, alternately, to an external binary source $ExtE_i$.

A second switch matrix FOFI can electrically connect and, alternatively, disconnect output $FO_j$ to/from any input $FI_k$, where "k" is different from "j".

A third matrix BIBO can electrically connect and, alternatively disconnect any input $BI_j$ to/from any output $BO_k$, where "k" is different from "j".

A fourth switch matrix BOAI can electrically connect and, alternately, disconnect input $AI_j$ to any outputs $BO_k$ where "k" is different from "j".

In circuit 2, when an input of a cluster is not connected to an output of another cluster, this input is electrically connected to ground that corresponds to a binary value equal to "0".

FIG. 4A shows switch matrix FOFI. Matrix FOFI is built from a great number of individual switches $FOFI_{nm}$. Each switch $FOFI_{nm}$ can electrically connect respective output $FO_n$ to a respective input $FI_m$ and, alternatively, electrically disconnect this output $FO_n$ from input $FI_m$. The matrix can be configured to make a one-to-one connection between an input and output or a one-to-many connections between output $FO_n$ and inputs FI. Typically, the switch matrix is realized using multiplexers.

In FIG. 4A, a vertical line is only electrically connected to a horizontal line if the corresponding switch $FOFI_{nm}$ is conducting.

Matrices SE, BIBO and BOAI are built in a similar way as the one illustrated in FIG. 4A.

For simplicity, in circuit 2, connections between two clusters on the same line are not configurable. For example, these connections are not implemented through a switch matrix. For example, outputs $S_0$, $FO_0$ and input $BI_0$ are directly connected to inputs $E_1$, $FI_1$ and output $BO_1$, without any configuration possibility.

For simplicity, only some switches of the switch matrices have been illustrated in FIG. 4.

More precisely, FIG. 4 shows four switches $SE_{12}$, $SE_{34}$, $SE_{56}$, $SE_{78}$ connected between output $S_j$ of the last cluster of the previous row and input $E_{j+1}$ of the first cluster of the following row.

FIG. 4 shows also four switches $BIBO_{12}$, $BIBO_{34}$, $BIBO_{56}$, $BIBO_{78}$ connected between input $BI_j$ of the last cluster of the previous row and input $BO_{j+1}$ of the first cluster of the following row.

Finally, FIG. 4 shows four switches $FOFI_{12}$, $FOFI_{34}$, $FOFI_{56}$, and $FOFI_{78}$ connected between the output of adder $A_{5,j}$ and input $FI_{j+1}$.

Switches of BOAI matrix have not being shown.

In circuit 2, outputs $TO_{ij}$ of cluster $CL_j$ are only connected to corresponding respective inputs $TI_{i,j+2}$ of the following cluster $CL_{j+2}$ in the same column.

Circuit 2 has also nine cluster configuration registers $RC_j$. Each cluster configuration register $RC_j$ contains the value of Ctm, Cmm0, Cmm1, Cbm and Cfm that determine the configuration of each cell $C_{i,j}$ of cluster $CL_j$ as well as the value of Ctm, Cmm0, Cmm1, Cbm0, Cbm1 and Cfm that determine the configuration of cell $Ce_{i,j}$ of cluster $CL_j$. Thus, the configuration of each cell of each cluster can be amended by modifying the values stored in each one of these registers $CR_j$.

Circuit 2 has also four switch matrix configuration registers $SR_1$ to $SR_{ij}$. These registers determine the configuration of the connections between the different clusters $CL_j$ of circuit 2. More precisely, each register SR contains binary information that determines if a given switch of the switch matrix is open or closed. Accordingly, those registers are used to configure the connections between clusters.

Circuit 2 has also an output stage 4 which is connected to every outputs of every cluster. Output stage 4 is designed to format the output of clusters $CL_j$ in order to transmit the result of the computation of circuit 2 on a eight-bit width parallel bus 6. For example, output stage 4 includes a multiplexer 10 that is connected to every outputs of each cluster. Nine outputs of multiplexer 10 are connected to respective inputs of a packager 12. Packager 12 is able to output the received bits one after the other in a FIFO (First In First Out) buffer 14 which can send the received data on bus 6.

Figure 5:
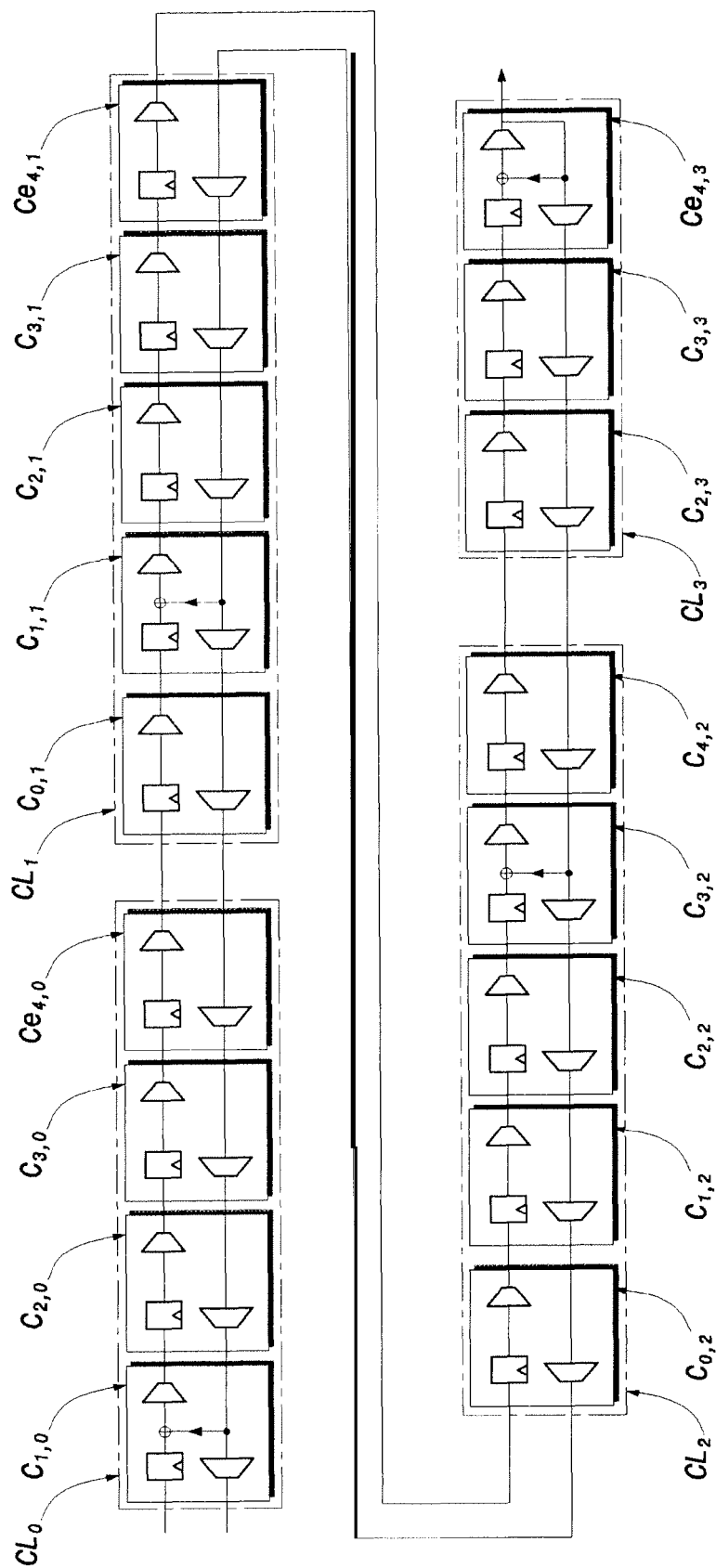
FIG. 5 is an illustration of a first configuration of the circuit of FIG. 4 to generate a CRC code.

FIG. 5 shows the configuration of circuit 2 to compute a CRC code as specified in standard WLAN or standard 802.11. More precisely, the configuration shown in FIG. 5 implements the generation and the check sequence of a CCITT CRC-16 bit generated with the following polynomial: $x^{16}+x^{12}+x^5+1$.

As shown in this configuration example, only four cells $C_{1,0}$ to $Ce_{4,0}$ of cluster $CL_0$ are used. In order to bypass cell $C_{0,0}$, multiplexers MM and TM are configured to directly connect input $E_{0,0}$ to output $S_{0,0}$. Thus, any cell within a cluster can be bypassed.

To implement the terms $x^{16}+x^{12}+x^5+1$ of the above polynomial, the multiplexers MM and TM of cells $C_{1,0}$, $C_{1,1}$, $C_{3,2}$ and $Ce_{4,3}$ are configured to directly connect the output of adder $A_{1i}$ to output $S_3$. The other cells which are not bypassed are only configured to implement a delay of one clock period.

In this configuration, the clusters $CL_0$ to $CL_3$ are series connected. More precisely, output $S_j$ is connected to input $E_{j+1}$ of the following cluster and input $BI_j$ is directly connected to output $BO_{j+1}$ of the following cluster $CL_{j+1}$.

In this embodiment, only four clusters are used.

In this configuration the data are input through input $E_0$ and the CRC code is read from output $S_3$.

Note that cell $Ce_{4,3}$ is configured so that output $S_3$ is directly connected to output $BO_{43}$ through multiplexer BM. Thus, multiplexer BM provides the source of the feedback branch.

Figure 6:
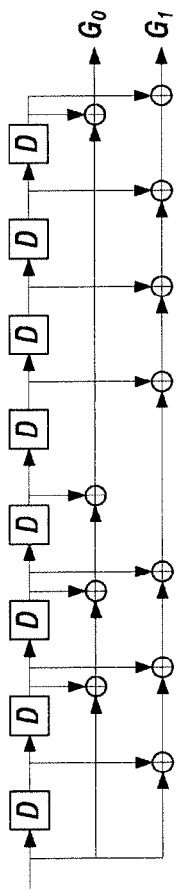
FIG. 6 is a schematic diagram of a convolutional encoder.

FIG. 6 shows a convolutional encoder with a rate of ½ which complies with UMTS standards. Cells D represent delay line of one clock period. This convolutional encoder is a well-known encoder that will not be described in further details. The results of the convolutional encoder are output through pins $G_0$ and $G_1$.

Figure 7:
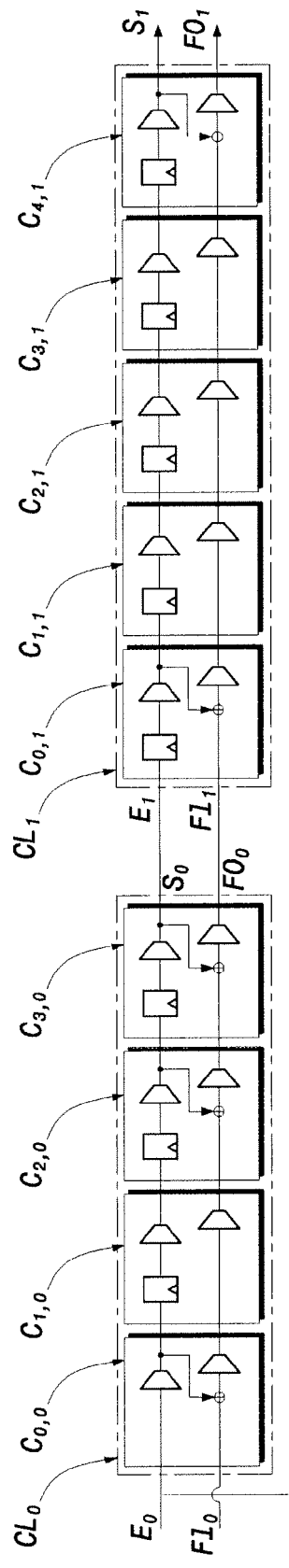
FIG. 7 is a schematic diagram of the configuration of the integrated circuit of FIG. 4 to implement the convolutional encoder of FIG. 6.
Figure 7:
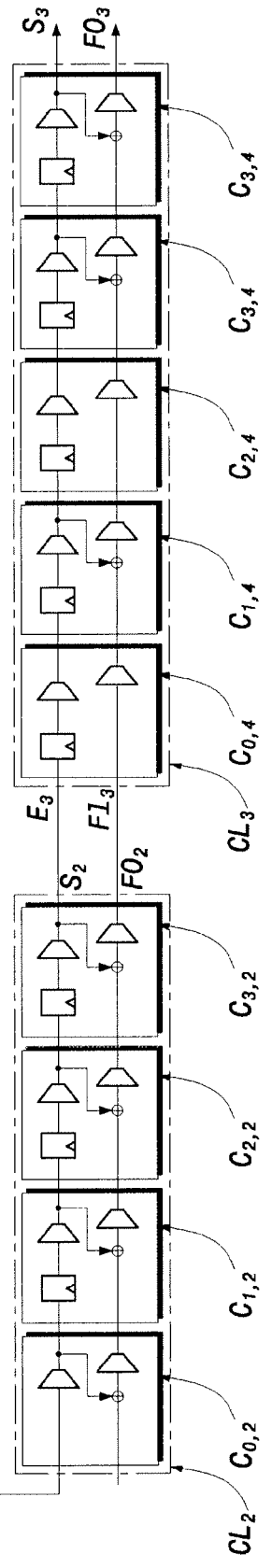

FIG. 7 shows the configuration of circuit 2 to implement the convolutional encoder of FIG. 6. Only four clusters $CL_0$ to $CL_3$ are used. Outputs $S_0$ and $FO_0$ are directly connected to inputs $E_1$ and $FI_1$. Similarly, outputs $S_2$ and $FO_2$ are directly connected to inputs $E_3$ and $FI_3$, respectively.

Inputs $E_0$ and $E_2$ receive the binary stream to be encoded.

Outputs $FO_1$ and $FO_3$ correspond to outputs $G_0$ and $G_1$ of FIG. 6.

Outputs $S_1$ and $S_3$ are not used. In the configuration of FIG. 7, cell $Ce_{4,0}$ and $Ce_{4,2}$ are bypassed. Switches $SE_{01}$ and $SE_{23}$ are conducting. Switches $FOFI_{01}$ and $FOFI_{23}$ are also conducting. Every other switch of the matrices is non-conducting. Adders $A_{5j}$ are not used.

Figure 8:
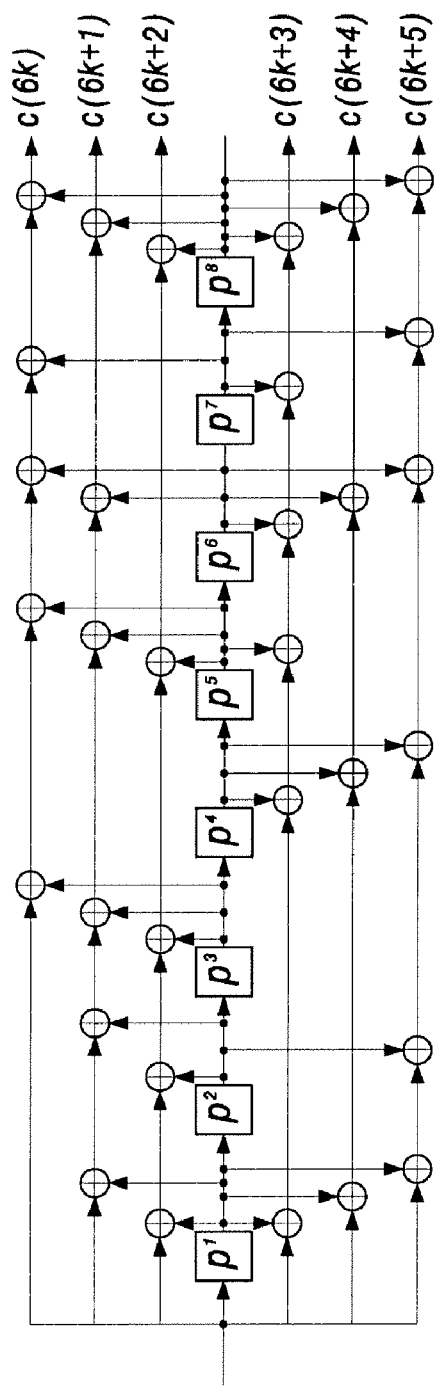
FIG. 8 is a schematic diagram of another conventional encoder.

FIG. 8 shows a convolutional encoder having a rate of ⅙. This convolutional encoder is defined in the standards concerning CDMA 2000. It will thus not be described in further details. Cells $P^i$ are delay lines of one clock period. The result of the convolution is output through outputs $c(6k)$, $c(6k+1)$, $c(6k+2)$, $c(6k+3)$, $c(6k+4)$ and $c(6k+5)$.

Figure 9:
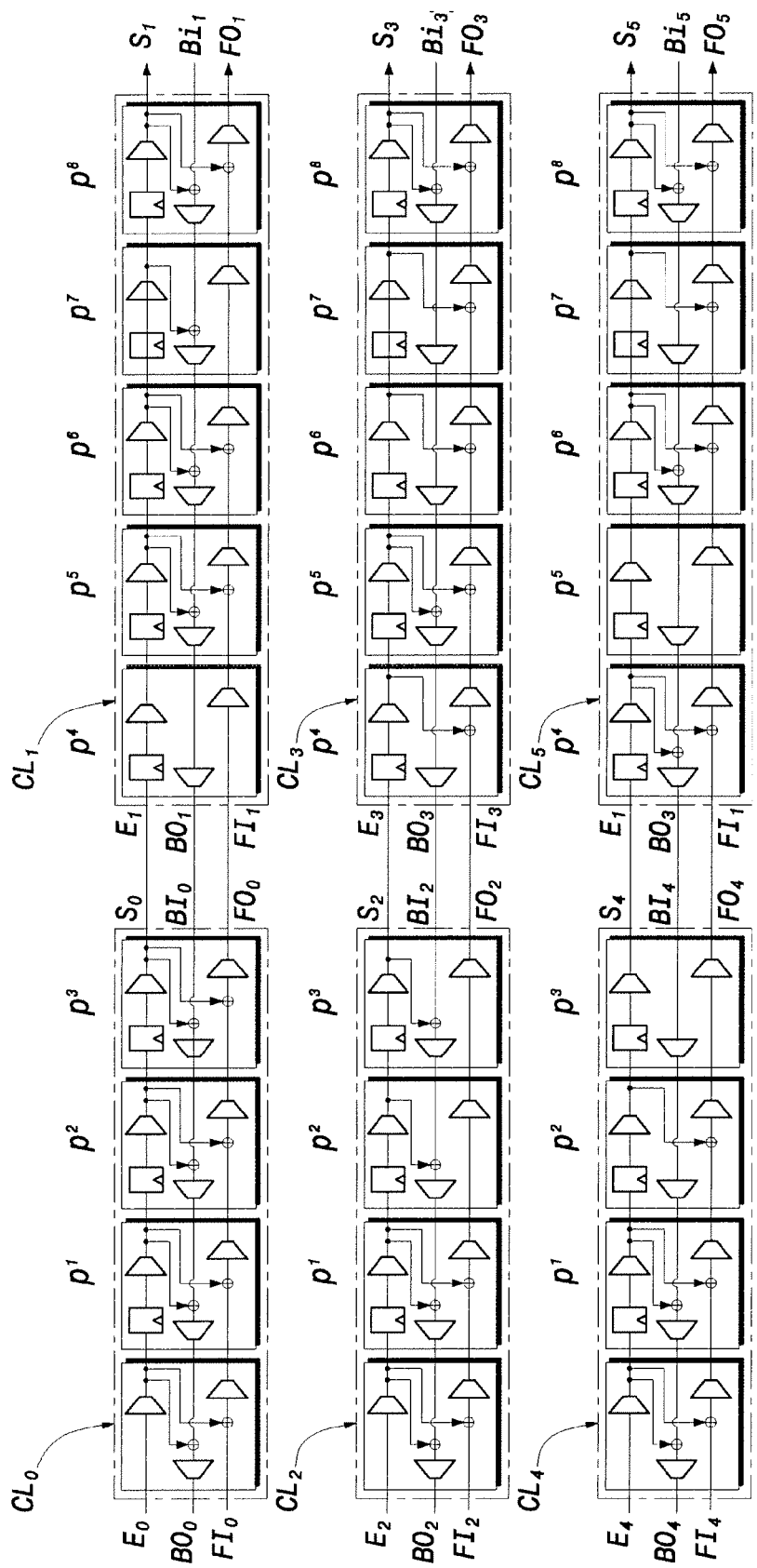
FIG. 9 is a schematic diagram of the configuration of the integrated circuit of FIG. 4 to implement the convolutional encoder of FIG. 8.

FIG. 9 illustrates the configuration of circuit 2 to implement the convolutional encoder of FIG. 8. This implementation only needs six clusters $CL_0$ to $CL_5$.

In this configuration, cells $Ce_{4,0}$, $Ce_{4,2}$ and $Ce_{4,4}$ are bypassed.

Inputs $E_0$, $E_2$ and $E_4$ receive the same binary input stream.

Outputs $FO_1$, $FO_3$ and $FO_5$ correspond to outputs $c(6k+1)$, $c(6k+3)$ and $c(6k+5)$ of the convolutional encoder of FIG. 8, respectively.

Outputs $BO_0$, $BO_2$ and $BO_{ij}$ correspond to outputs $c(6k)$, $c(6k+2)$, $c(6k+4)$ of the convolutional encoder of FIG. 8, respectively.

Outputs $S_1$, $S_3$ and $S_5$ are not used.

Inputs $FI_0$, $FI_2$ and $FI_4$ and inputs $BI_1$, $BI_3$ and $BI_5$ are connected to ground.

In this configuration, it should be noted that outputs $c(6k)$, $c(6k+2)$, $c(6k+4)$ are computed by using feedback branches of the clusters whereas output $c(6k+1)$, $c(6k+3)$ and $c(6k+5)$ are computed by using forward branches of the same clusters. Thus, only six clusters are needed instead of twelve clusters if only forward branches were used.

Figure 10:
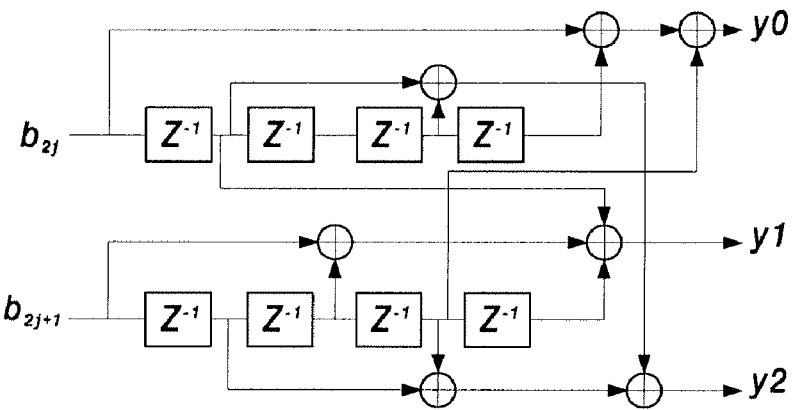
FIG. 10 is a schematic diagram of another convolutional encoder with inter-branch connections.

FIG. 10 shows a convolutional encoder with interbranch connections. The illustrated convolutional encoder is described in more details in the standard WLAN 802.11g or DSSS 22 and 33 Mbit/s. Cells with symbol $Z^{-1}$ are delay lines of one clock period. This encoder receives input signal $b_{2j}$ and $b_{2j+1}$ and outputs three binary streams $y_0$, $y_1$ and $y_2$.

An interbranch connection is a connection through a adder between two different forward branches, for example.

Figure 11:
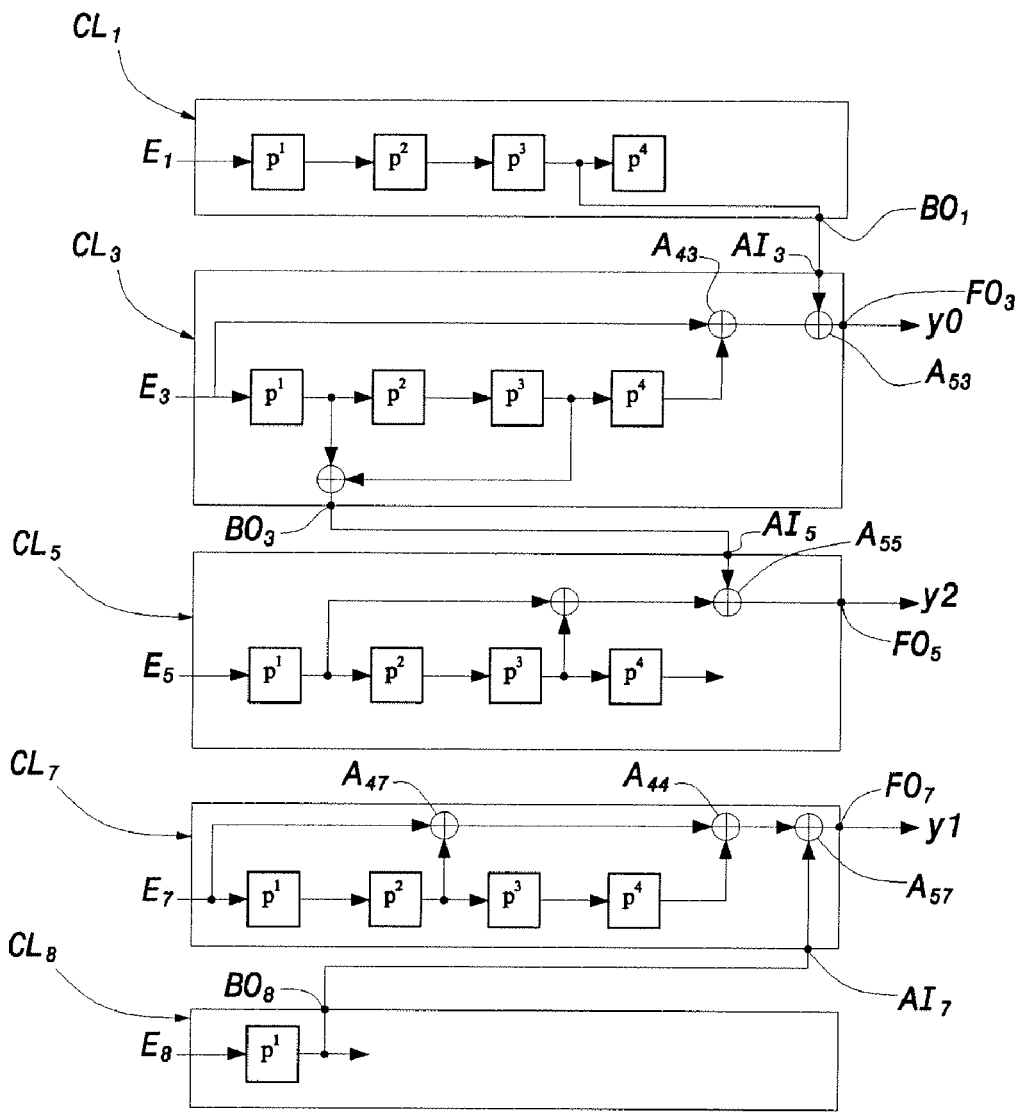
FIG. 11 is a schematic diagram of the configuration of the integrated circuit of FIG. 4 to implement the convolutional encoder of FIG. 10.

FIG. 11 shows the configuration of circuit 2 to implement the convolutional encoder of FIG. 10. In this configuration, only clusters $CL_1$, $CL_3$, $CL_5$, $CL_7$ and $CL_8$ are used. The cells of clusters $CL_0$, $CL_2$, $CL_4$ and $CL_8$ are bypassed.

In this embodiment, the switch matrix BOAI is used to connect output $BO_1$, to input $AI_3$, output $BO_3$ to input $AI_5$ and output $BO_8$ to input $AI_7$.

Inputs $E_3$, $E_8$ receive binary stream $b_{2j}$. Inputs $E_1$, $E_5$, and $E_7$ receive binary stream $b_{2j+1}$.

Binary stream $y_0$, $y_1$ and $y_2$ correspond to outputs $FO_3$, $FO_7$ and $FO_5$, respectively.

Figure 12A:
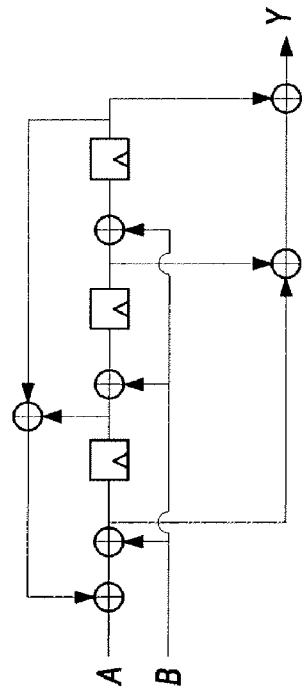
FIG. 12A is a schematic diagram of a turbo coder.

FIG. 12A shows a turbo-coder which complies with the following transmission technology:

WMAN-SCa,
WMAN-OFDM,
WMAN-OFDMA.

This turbo-coder is well known and will not be described in further details hereinafter. This turbo-coder has two inputs A and B and one output Y.

Figure 12B:
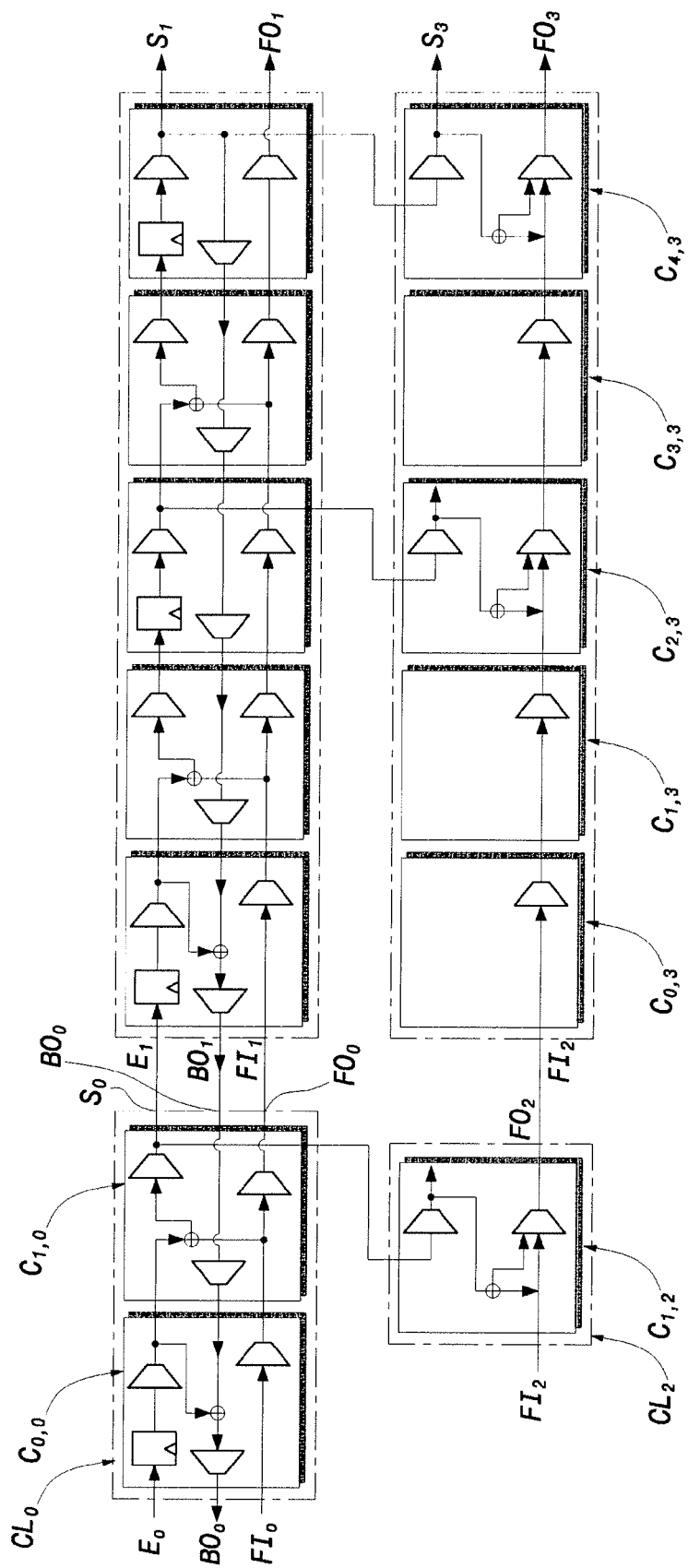
FIG. 12B is a schematic diagram of the configuration of the integrated circuit of FIG. 4 to implement the convolutional turbo coder.

FIG. 12B shows the configuration of circuit 2 to implement the turbo-coder of FIG. 12A. In the illustrated configuration, it has been assumed that circuit 2 has simplified switch matrices which does not allow to configure the connections between two successive clusters in the same row.

As illustrated in FIG. 12B, the simplification of the switch matrix does not prevent from configuring circuit 2 to implement the turbo-coder of FIG. 12A.

In this configuration, inputs $E_0$ and $FI_0$ correspond to inputs A and B of FIG. 12A. Outputs $FO_3$ corresponds to output Y of FIG. 12A.

Outputs $BO_0$, $S_1$, $FO_1$, $S_3$ are not used.

FIG. 13A shows a scrambler which is defined in the UMTS standards for HS-DSCH or commonly called HSDPA (High Speed Downlink Packet Access). Thus, this scrambler will not be described in further details. It has a bit stream input $b_R$ and a bit stream output $d_k$. Cells with symbol $p^i$ are delay lines of one clock period.

FIG. 13B shows the configuration of circuit 2 to implement the scrambler of FIG. 13A.

Only five clusters $CL_0$ to $CL_4$ are used. Input $E_0$ receives the bit stream $b_k$. Output $FO_0$ outputs the bit stream corresponding to bit stream $d_k$ of FIG. 13A. Output $S_0$ and $S_4$ are not used.

Many other embodiments are possible. For example, inputs $TI_{ij}$ and outputs $TO_{ij}$ can be omitted if coding schemes requiring such transversal connections are not required. In another embodiment, adder $A_{5j}$ can also be omitted.

Circuit 2 has been disclosed in the specific case where it comprises nine clusters of five cells. However, such an integrated circuit can also be built using only five to ten clusters. This range of number of clusters corresponds to configurations which are both flexible and fast in executing any calculation of code.

The size of the switch matrices can be reduced if cluster $CL_j$ can only be connected to the following cluster $CL_{j+1}$. This also reduces the size of the corresponding configuration registers $SR_1$ to $SR_4$. It is also possible to reduce the size of the switch matrices by having only one output to be connected to only one input of another cluster.

Cell $Ce_{i,j}$ can be omitted if it is not necessary to implement the generation of CRC codes.

The additional adders $A_{5j}$ connected between outputs $FO_{4j}$ and output $FO_j$ can be replaced by an adder connected between output $S_{4j}$ and output $S_j$.

In the present specification and claims the word "a" or "an" preceding an element does not exclude the presence of a plurality of such elements. Further, the word "comprising" does not exclude the presence of other elements or steps than those listed.

The inclusion of reference signs in parentheses in the claims is intended to aid understanding and is not intended to be limiting.

From reading the present disclosure, other modifications will be apparent to persons skilled in the art. Such modifications may involve other features which are already known in the art of encoding data and which may be used instead of or in addition to features already described herein.

The invention claimed is:

1. An integrated circuit configurable to encode data according to one of a predetermined plurality of coding schemes comprising block, convolutional and turbo codes and to generate cyclic redundancy codes, said integrated circuit comprising:
   a) a plurality of specific hardware cells, each cell comprising:
       outputs $S_{ij}$, $FO_{ij}$, $BO_{ij}$ and $TO_{ij}$ for binary signals,
       inputs $E_{ij}$, $BI_{ij}$, $FI_{ij}$ and $TI_{ij}$ for binary signals,
       a buffer to delay by one clock period a binary value received on input $E_{ij}$ and to output a one-clock period delayed binary value $E^*$,
       binary adders to perform XOR operations,
       configurable multiplexers connecting the outputs, the inputs, the buffer and the adders to each other according to several configurable paths, the characteristic equations of the cell being:

$$TO_{ij}=S_{ij}\cdot Ctm\cdot TI_{ij}+!Ctm\cdot Output Mux4$$

$$Output Mux4=Cmm0\cdot Cmm1\cdot E^*+!Cmm0\cdot Cmm1\cdot (E^*XORBI_{ij})+Cmm0\cdot!Cmm1\cdot E+!Cmm0\cdot!Cmm1\cdot (E_{ij}XORFI_{ij})$$

$$BO_{ij}=Cbm\cdot (S_{ij}XORBI_{ij})+!Cbm\cdot BI_{ij}$$

or $$BO_{ij}=Cbm0\cdot Cbm1\cdot (S_{ij}XORBI_{ij})+!Cbm0\cdot Cbm1\cdot BI_{ij}+!Cbm0\cdot Cbm1\cdot S_{ij}$$

$$FO_{ij}=Cfm\cdot (S_{ij}XORFI_{ij})+!Cfm\cdot FI_{ij}$$

where:

$S_{ij}$, $FO_{ij}$, $BO_{ij}$ and $TO_{ij}$ are the binary signals output on outputs $S_{ij}$, $FO_{ij}$, $BO_{ij}$ and $TO_{ij}$, respectively, $E_{ij}$, $BI_{ij}$, $FI_{ij}$ and $TI_{ij}$ are the binary signals received on inputs $E_{ij}$, $BI_{ij}$, $FI_{ij}$ and $TI_{ij}$, respectively, "!" is the NOT operation, "*" is the output of the buffer, "XOR" is the XOR operation, "+" is the OR operation, "·" is the AND operation, Cbm, Cbm0, Cbm1, Cfm, Cmm0, Cmm1 and Ctm are respective binary values that represent the configuration of each multiplexer, b) controllable switch matrices external to each cell and able:
   to electrically connect and, alternatively, to electrically disconnect input $E_{ij}$ to/from at least the output $S_{ij}$ of another cell and to electrically connect and, alternately, to electrically disconnect input $E_{ij}$ to/from an external binary data source,
   to electrically connect and, alternatively, to electrically disconnect at least input $FI_{ij}$ to/from at least the output $FO_{ij}$ of another cell,
   to connect and, alternately, to disconnect input to/from at least the output $BO_{ij}$ of another cell.

2. An integrated circuit configurable to encode data according to one of a predetermined plurality of coding schemes comprising block, convolutional and turbo codes and to generate cyclic redundancy codes, said integrated circuit comprising:
   a) a plurality of specific hardware cells, each cell comprising:
       outputs $S_{ij}$, $FO_{ij}$, and $BO_{ij}$ for binary signals,
       inputs $E_{ij}$, $BI_{ij}$, and $FI_{ij}$ for binary signals,
       a buffer to delay by one clock period a binary value received on input $E_{ij}$ and to output a one-clock period delayed binary value $E^*$,
       binary adders to perform XOR operations,
       configurable multiplexers connecting the outputs, the inputs, the buffer and the adders to each other according to several configurable paths, the characteristic equations of the cell being:

$$S_{ij}=!Ctm\cdot Output Mux4$$

$$Output Mux4=Cmm0\cdot Cmm1\cdot E^*+!Cmm0\cdot Cmm1\cdot (E^*XORBI_{ij})+Cmm0\cdot!Cmm1\cdot E+!Cmm0\cdot!Cmm1\cdot (E_{ij}XORFI_{ij})$$

$$BO_{ij}=Cbm\cdot (S_{ij}XORBI_{ij})+!Cbm\cdot BI_{ij}$$

or $$BO_{ij}=Cbm0\cdot Cbm1\cdot (S_{ij}XORBI_{ij})+!Cbm0\cdot Cbm1\cdot BI_{ij}+!Cbm0\cdot Cbm1\cdot S_{ij}$$

$$FO_{ij}=Cfm\cdot (S_{ij}XORFI_{ij})+!Cfm\cdot FI_{ij}$$

where:

$S_{ij}$, $FO_{ij}$ and $BO_{ij}$ are the binary signals output on outputs $S_{ij}$, $FO_{ij}$ and $BO_{ij}$, respectively, $E_{ij}$, $BI_{ij}$ and $FI_{ij}$ are the binary signals received on inputs $E_{ij}$, $BI_{ij}$ and $FI_{ij}$, respectively, "!" is the NOT operation, "*" is the output of the buffer;

"XOR" is the XOR operation,

"+" is the OR operation,

"·" is the AND operation,

Cbm, Cbm0, Cbm1, Cfm, Cmm0, and Cmm1 are respective binary values that represent the configuration of each multiplexer, b) controllable switch matrices external to each cell and able:
to electrically connect and, alternatively, to electrically disconnect input $E_{ij}$ to/from at least the output $S_{ij}$ of another cell and to electrically connect and, alternately, to electrically disconnect input $E_{ij}$ to/from an external binary data source,
to electrically connect and, alternatively, to electrically disconnect at least input $FI_{ij}$ to/from at least the output $FO_{ij}$ of another cell,
to connect and, alternatively, to disconnect input $BI_{ij}$ to/from at least the output $BO_{ij}$ of another cell.

3. The integrated circuit according to claim 2, wherein the integrated circuit comprises a plurality of clusters $CL_j$, each cluster $CL_j$ comprising:
inputs $E_j$, $FI_j$ and $BI_j$,
outputs $S_j$, $BO_j$ and $FO_j$,
a succession of at least two cells $C_{ij}$ successively electrically connected to each other, the first cell of the succession having its inputs and $FI_{ij}$ and its output $BO_{ij}$ directly connected to inputs $E_j$, $FI_j$ and output $BO_j$ without configuration possibility, respectively,
the last cell of the succession having its input and its outputs $S_{ij}$ and $FO_{ij}$ connected, without configuration possibility to input $BI_j$, outputs $S_j$ and $FO_j$, respectively, and
any cell other than the last cell having its input $BI_1$ and its outputs $S_{ij}$ and $FO_{ij}$ connected, without any configuration possibility, to output $BO_{ij}$ and inputs $E_{ij}$ and $FI_{ij}$ of the following cell of the succession, respectively, and
wherein the switch matrix is only able to configure the electrical connections between cluster inputs and outputs without being able to configure the electrical connections between cells within a cluster.

4. The integrated circuit according to claim 3, wherein the outputs $S_j$, $FO_j$ and the input $BI_j$ of at least one cluster are connected to inputs $E_j$, $FI_j$ and output $BO_j$ of another cluster without configuration possibility, respectively.

5. The integrated circuit according to claim 3, wherein the integrated circuit comprises between five to ten clusters and each cluster is composed of five cells.

6. The integrated circuit according to claim 3, wherein each cluster has at least one cell having the following characteristic equation:

$$BO_{ij}=Cbm0\cdot Cbm1\cdot(S_{ij} XOR BI_{ij})+!Cbm0\cdot Cbm1 BI_{ij}+!Cbm0\cdot Cbm1\cdot S_{ij}.$$

7. The integrated circuit according to claim 3, wherein the inputs $TI_{ij}$ of the succession of cells of a cluster, are directly connected to respective outputs $TO_{ij}$ of the succession of cells of another cluster without any configuration possibility.

8. The integrated circuit according to claim 3, wherein a cluster $CL_j$ comprises an input $AI_j$ and an adder having an first input directly connected to input $AI_j$, a second input and an output, the second input and the output of the adder being:
either connected to output $FO_{ij}$ of the last cell and to output $FO_j$, respectively,
or connected to output $S_{ij}$ of the last cell and to output $S_j$, respectively.

9. A hardware cell optimized for use in an integrated circuit encoder comprising:
a first input $E_{ij}$, a second input $BI_{ij}$, a third input $FI_{ij}$ and a fourth input $TI_{ij}$, each of said first, second, third and fourth inputs being for binary signals,
a first output $S_{ij}$, a second output $FO_{ij}$, a third output $BO_{ij}$ and a fourth output $TO_{ij}$, each of said first, second, third and fourth outputs being for binary signals;
a buffer $BU_j$ having an input connected to said first input $E_{ij}$ and an output generating a binary value E*;
a first adder $A_{1i}$ having a first input and a second input respectively coupled to the output of said buffer $BU_j$ and to said second input $BI_{ij}$, said first adder $A_{1i}$ having an output;
a second adder $A_{2i}$ having a first input coupled to said second input $BI_{ij}$, a second input and having further an output;
a third adder $A_{3i}$ having a first input and a second input respectively coupled to said first input $E_{ij}$ and said third input $FI_{ij}$, said third adder $A_{3i}$, having an output;
a fourth adder $A_{4j}$ having a first input connected to said third input $FI_{ij}$ a second input and further having an output;
a first multiplexer MM having a first, a second, a third and a fourth input respectively coupled to the output of said buffer, to the output of said first adder $A_{1i}$, to said first input $E_{ij}$ and to the output of said third adder $A_{3i}$, and having an output connected to anyone of its inputs depending on the contents of a cell configuration register;
a second multiplexer TM having a first and a second input respectively coupled the output of said first multiplexer MM and said fourth input $TI_{ij}$, and having an output connected to anyone of its inputs depending on the contents of said configuration register and being further coupled to said second input of said second adder $A_{2i}$, to the second input of said fourth adder $A_{4i}$ and to said fourth output $TO_{ij}$,
a third multiplexer BM having a first and a second input respectively coupled to the output of said second adder $A_{2i}$ and said second input $BI_{ij}$, and having an output coupled to said third output $BO_{ij}$ and being connected to anyone of its inputs depending on the contents of said cell configuration register;
a fourth multiplexer FM having a first and a second input respectively coupled to said third input $FI_{ij}$ and to the output of said fourth adder $A_{4i}$, and having an output coupled to said second output $FO_{ij}$ and connected to an one of its inputs depending on the contents of said cell configuration register.

10. An integrated circuit encoder comprising:
a plurality of hardware cells in electrical communication as defined in claim 9; and
a programmable switch matrix coupled to the plurality of hardware cells.

11. The integrated circuit encoder of claim 10 wherein the switch matrix is only able to configure electrical connections between inputs and outputs of a cluster of hardware cells without being able to configure the electrical connections between hardware cells within a cluster of hardware cells.

12. The integrated circuit encoder of claim 10 configured to provide convolutional encoding operations that comply with any one of the following standards: GSM, UMTS, DMB, CDMA 2000, iDEN (Integrated Digital Enhanced Network), PHS (Personal Handy-phone System), PDC (Personal Digital Cellular), WPAN, WLAN, WMAN, or DVB (Digital Video Broadcasting).

13. The integrated circuit encoder of claim 10 configured to provide turbo encoding operations that comply with any one of the following standards: UMTS, SDMB (Satellite Digital Multimedia Broadcasting), CDMA 2000, or WMAN.

14. The integrated circuit encoder of claim 10 configured to provide randomization and scrambling operations that comply with any one of the following standards: UMTS, CDMA 2000, WMAN, WLAN, DMB, DAB, or DVB.

15. The integrated circuit encoder of claim 10 configured to provide a spreading process.

* * * * *

UNITED STATES PATENT AND TRADEMARK OFFICE
CERTIFICATE OF CORRECTION

PATENT NO. : 8,312,355 B2
APPLICATION NO. : 12/514424
DATED : November 13, 2012
INVENTOR(S) : Martial Gander and Emmanuel Ardichvili It is certified that error appears in the above-identified patent and that said Letters Patent is hereby corrected as shown below:

In the Claims:

Column 11, line 53, $TO_{ij}=S_{ij}=Ctm \cdot TI_{ij}+!Ctm \cdot OutputMux4$ should be $TO_{ij} = S_{ij} = Ctm.TI_{ij} + !Ctm. OutputMux4$ Column 11, lines 54-56, $OutputMux4 =$
$Cmm0 \cdot Cmm1 \cdot E^* + !Cmm0 \cdot Cmm1 \cdot (E^* XORBI_{ij}) +$
$Cmm0 \cdot !Cmm1 \cdot E + !Cmm0 \cdot !Cmm1 \cdot (E_{ij} XORFI_{ij})$ should be $OutputMux4 =$
$Cmm0 . Cmm1 . E^* + !Cmm0 . Cmm1 . (E^* \ XOR \ BI_{ij}) +$
$Cmm0 . !Cmm1 . E + !Cmm0 . !Cmm1 . (E_{ij} \ XOR \ FI_{ij})$ Column 11, line 57, $BO_{ij}=Cbm \cdot (S_{ij} XORBI_{ij})+!Cbm \cdot BI_{ij}$ should be $BO_{ij} = Cbm . (S_{ij} \ XOR \ BI_{ij}) + !Cbm . BI_{ij}$ Signed and Sealed this
Thirtieth Day of April, 2013

Teresa Stanek Rea
*Acting Director of the United States Patent and Trademark Office*

CERTIFICATE OF CORRECTION (continued)
U.S. Pat. No. 8,312,355 B2

Column 11, lines 59-60, $BO_{ij} = Cbm0 \cdot Cbm1 \cdot (S_{ij} XOR BI_{ij}) + !Cbm0 \cdot Cbm1 \cdot BI_{ij} + !Cbm0 \cdot Cbm1 \cdot S_{ij}$ should be $BO_{ij} = Cbm0 \,.\, Cbm1 \,.\, (S_{ij}\, XOR\, BI_{ij}) + !Cbm0 \,.\, Cbm1 \,.\, BI_{ij} + !Cbm0 \,.\, Cbm1 \,.\, S_{ij}$ Column 11, line 61, $FO_{ij} = Cfm \cdot (S_{ij} XOR FI_{ij}) + !Cfm \cdot FI_{ij}$ should be $FO_{ij} = Cfm \,.\, (S_{ij}\, XOR\, FI_{ij}) + !Cfm \,.\, FI_{ij}$ Column 12, line 9, "·" is the AND operation, should be "." is the AND operation, Column 12, line 23, after input insert --$BI_{ij}$--

Column 12, line 42, $S_{ij} = !Ctm \cdot Output\, Mux4$ should be $S_{ij} = !Ctm \,.\, OutputMux4$ Column 12, lines 43-45, OutputMux4 =

$Cmm0 \cdot Cmm1 \cdot E^* + !Cmm0 \cdot Cmm1 \cdot (E^* XOR BI_{ij}) +$ $Cmm0 \cdot !Cmm1 \cdot E + !Cmm0 \cdot !Cmm1 \cdot (E_{ij} XOR FI_{ij})$ should be OutputMux4 =

$Cmm0 \,.\, Cmm1 \,.\, E^* + !Cmm0 \,.\, Cmm1 \,.\, (E^* XOR BI_{ij}) +$ $Cmm0 \,.\, !Cmm1 \,.\, E + !Cmm0 \,.\, !Cmm1 \,.\, (E_{ij} XOR FI_{ij})$

Column 12, line 46, $$BO_{ij}=Cbm \cdot (S_{ij} \text{ XOR } BI_{ij})+!Cbm \cdot BI_{ij}$$

should be $$BO_{ij} = Cbm . (S_{ij} \text{ XOR } BI_{ij}) + !Cbm . BI_{ij}$$

Column 12, lines 48-49, $$BO_{ij}=Cbm0 \cdot Cbm1 \cdot (S_{ij} \text{XOR} BI_{ij})+!Cbm0 \cdot Cbm1 \cdot BI_{ij}+!Cbm0 \cdot Cbm1 \cdot S_{ij}$$

should be $$BO_{ij} = Cbm0 . Cbm1 . (S_{ij} \text{ XOR } BI_{ij}) + !Cbm0 . Cbm1 . BI_{ij} + !Cbm0 . Cbm1 . S_{ij}$$

Column 12, line 50, $$FO_{ij}=Cfm \cdot (S_{ij}\text{XORF}I_{ij})+!Cfm \cdot FI_{ij}$$

should be $$FO_{ij} = Cfm . (S_{ij} \text{ XOR } FI_{ij}) + !Cfm . FI_{ij}$$

Column 12, line 60,

"·" is the AND operation, should be

"." is the AND operation,

Column 13, line 23, after inputs insert --$E_{ij}$--

Column 13, line 26, after input insert --$BI_{ij}$--

Column 13, line 29, "$BI_1$," should be --$BI_{ij}$--

Column 13, lines 47-48, $$BO_{ij}=Cbm0 \cdot Cbm1 \cdot (S_{ij}\text{XORB}I_{ij})+!Cbm0 \cdot Cbm1 BI_{ij}+!Cbm0 \cdot Cbm1 \cdot S_{ij,}$$

should be $$BO_{ij} = Cbm0 . Cbm1 . (S_{ij} \text{ XOR } BI_{ij}) + !Cbm0 . Cbm1 . BI_{ij} + !Cbm0 . Cbm1 . S_{ij,}$$

Column 14, lines 43-44, "an one" should be --any one--

UNITED STATES PATENT AND TRADEMARK OFFICE
CERTIFICATE OF CORRECTION

PATENT NO. : 8,312,355 B2
APPLICATION NO. : 12/514424
DATED : November 13, 2012
INVENTOR(S) : Gander et al.

Page 1 of 2

It is certified that error appears in the above-identified patent and that said Letters Patent is hereby corrected as shown below:

On the title page

In the Figure, in Column 1, delete "$FI_{j,j}$" and insert -- $FI_{i,j}$ --, therefor.

In the Figure, in Column 1, delete "tM" and insert -- TM --, therefor.

In the drawings

In Fig. 1, Sheet 1 of 11, delete "$FI_{j,j}$" and insert -- $FI_{i,j}$ --, therefor.

In Fig. 1, Sheet 1 of 11, delete "tM" and insert -- TM --, therefor.

In the specification

In Column 1, Lines 12-15, delete "Integrated configurable circuits exist to encode data according to any one of a plurality of coding schemes and/or to generate cycle redundancy codes. Typically, the code scheme comprises block, convolutional and turbo codes.".

In Column 1, Line 24, delete "There exist integrated configurable circuits to" and insert -- Integrated configurable circuits exist to --, therefor.

In Column 1, Line 36, delete "pretty flexible" and insert -- flexible --, therefor.

In Column 2, Lines 63-64, delete "$(E*XOR+BI_{ij})+Cmm0 \cdot !Cmm1 \cdot E + !Cmm0 \cdot !Cmm1 \cdot (E_{ij}XORFI_{ij})$" and insert -- $(E^* \text{ XOR } BI_{ij}) + Cmm0 . !Cmm1 . E + !Cmm0 . !Cmm1 . (E_{ij} \text{ XOR } FI_{ij})$ --, therefor.

In Column 4, Line 17, delete "clusters cluster" and insert -- clusters --, therefor.

Signed and Sealed this
Tenth Day of May, 2016

Michelle K. Lee
*Director of the United States Patent and Trademark Office*

CERTIFICATE OF CORRECTION (continued)

U.S. Pat. No. 8,312,355 B2

In the specification

In Column 5, Line 39, delete "$E_{ij}$, $BI_{ij}$" and insert -- $E_{ij}$, $FI_{ij}$, $BI_{ij}$ --, therefor.

In Column 5, Line 55, delete "$A_{31}$" and insert -- $A_{3i}$ --, therefor.

In Column 6, Line 9, delete "$A_{4i}$" and insert -- $A_{4i,}$ --, therefor.

In Column 6, Line 22, delete "$(E \cdot {}^{*}XORBI_{ij})+Cmm0 \cdot !Cmm1 \cdot E_{ij}+$" and insert -- $(E\ {}^{*}XORBI_{ij})+Cmm0 \cdot !Cmm1 \cdot E_{ij}+$ --, therefor.

In Column 6, Line 64, delete "to" and insert -- $FI_{ij}$ to --, therefor.

In Column 7, Line 38, delete "cell" and insert -- cell $C_{i+1j}$ --, therefor.

In Column 7, Line 57, delete "$CL_5$" and insert -- $CL_8$ --, therefor.

In Column 8, Line 58, Delete "Crj." and insert -- Rcj. --, therefor.

In Column 8, Line 60, delete "$SR_{ij}$." and insert -- $SR_4$. --, therefor.

In Column 10, Line 4, delete "$BO_{ij}$" and insert -- $BO_4$ --, therefor.

In Column 10, Line 28, delete "$CL_8$" and insert -- $CL_6$ --, therefor.

In the claims

In Column 13, Line 56, in Claim 8, delete "$AI_i$ and an adder having an first" and insert -- $AI_j$ and an adder having a first --, therefor.

In Column 14, Line 4, in Claim 9, delete "$BU_j$" and insert -- $BU_i$ --, therefor.

In Column 14, Line 17, in Claim 9, delete "$A_{4j}$" and insert -- $A_{4i}$ --, therefor.